Figure 1:
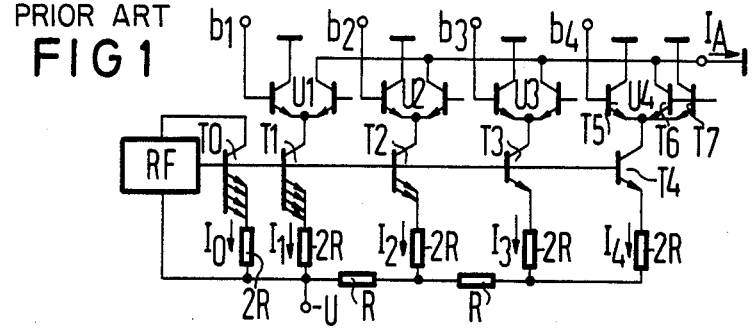

United States Patent [19]

Luschnig

[11] Patent Number: 4,583,076
[45] Date of Patent: Apr. 15, 1986

[54] INTEGRABLE DIGITAL/ANALOG CONVERTER

[75] Inventor: Werner Luschnig, Magdalen, Austria

[73] Assignee: Siemens Aktiengesellschaft, Berlin and Munich, Fed. Rep. of Germany

[21] Appl. No.: 651,815

[22] Filed: Sep. 18, 1984

[30] Foreign Application Priority Data

Sep. 20, 1983 [DE] Fed. Rep. of Germany ....... 3333934

[51] Int. Cl.$^4$ ............................................. H03M 1/66
[52] U.S. Cl. ............................................. 340/347 DA
[58] Field of Search ................................. 340/347 DA

[56] References Cited

U.S. PATENT DOCUMENTS 4,055,773 10/1977 Schoeff ........................ 340/347 DA
4,384,274 5/1983 Mao ............................. 340/347 DA

OTHER PUBLICATIONS

Günter Pretzl, Monolithische D/A–und A/D–Umsetzer, 1977, pp. 38–46 of No. 3.

Primary Examiner—L. T. Hix
Assistant Examiner—David M. Gray
Attorney, Agent, or Firm—Herbert L. Lerner; Laurence A. Greenberg

[57] ABSTRACT

An integrable digital/analog converter in bipolar technology for bits of a digital data word signal to be processed, includes individual converter stages assigned to bits of the signal to be processed, the stages each including a constant current-source transistor with equal doping and weighting like that of the constant current, and a double-throw switch connecting the collector of the current-source transistor to an output terminal or another terminal depending on the logical state of the bit. Emitter series resistors are connected between the emitters of the current-source transistors and an emitter potential supply terminal, the resistors being weighted by different dimensioning. The converter stages are divided into two groups with higher and lower bit values, the emitter areas of the current-source transistors of the first group being weighted. A reference potential circuit is provided for receiving a reference current. A first current reflector is formed of transistors. Two further transistors control the transistors of the first group. Two of the emitter series resistors are connected between the further transistors and the emitter potential supply terminal. A second current reflector is connected to the emitter potential supply terminal and it includes output transistors connected to the current-source transistors of the second group. Transmission transistors are connected to the current-source transistors of the second group and to the reference circuit. The emitter areas of the transmission transistors are binary-weighted according to the bit value associated with the current-source transistors of the second group.

6 Claims, 2 Drawing Figures

INTEGRABLE DIGITAL/ANALOG CONVERTER

The invention relates to an integrable digital/analog converter in bipolar technology, including stages, each being formed of a transistor operated as a constant-current source and a double-throw switch assigned to each bit of the digital data signal to be processed, the individual converter stages being constructed in such a manner that in the logical state "1" of the bit addressing the respective stage, the collector of the constant-current transistor forming the output of the constant-current source is applied to the signal output of the converter, and in the logical state "0" of this bit, the collector is applied to a common other terminal, such as the supply or reference potential terminal, emitter series resistors connecting the emitters of the current-source transistor to the supply terminal for the emitter potential VEE of the converter, the resistor being given a weighting corresponding to the bit value acting upon the associated double-throw switch in the stages of the converter, depending on the bit value of the bit addressing the individual stage in the digital data word to be evaluated by providing an appropriate, different dimensioning; and the current-source transistors in the stages of the converter agreeing with respect to the doping of the emitter, the base and the collector, while weighting with respect to the emitter area of the current-source transistors is provided, specifically in the same sense as the weighting of the constant current supplied by the current-source transistor.

Such a structure for a digital-analog converter is described in the publication "Elektronik" (1977), No. 3, pp. 38 et seq., (especially page 40). A corresponding circuit is shown in FIG. 1, which will be discussed below. The disadvantages of the prior art device shown in FIG. 1 will also be discussed below.

In digital-to-analog converters which work with weighted constant currents, the weighting can be accomplished by providing a parallel connection of a number of identical and identically controlled transistors corresponding to the respective weighting. However, it is simpler to make the current-source transistors the same and to achieve the weighting by the appropriate dimensioning of the emitter series resistors of the individual current-source transistors, which is most simply accomplished by using a suitable resistor network, such as an R/2R network which connects the emitters of the current-source transistors to the supply terminal furnishing the emitter potential VEE.

It is accordingly an object of the invention to provide an integrable digital/analog converter which overcomes the disadvantages of the heretofore-known devices of this general type.

With the foregoing and other objects in view there is provided, in accordance with the invention, an integrable digital/analog converter in bipolar technology for bits of a digital data word signal to be processed, comprising:

a signal output terminal;
another common terminal;
an emitter potential supply terminal;
individual converter stages each being assigned to a respective bit of the digital data signal to be processed, each converter stage including a transistor operated as a constant-current source and a double-throw switch connected to the constant-current source transistor, to the signal output terminal and to the other common terminal, for each of the converter stages, in the logical state "1" of the bit addressing the converter stage, the other double-throw switch connecting the collector of the constant-current source transistor forming the output of the constant-current source to the signal output terminal of the converter, and in the logical state "0" of the bit, the double-throw switch connecting the collector of the constant-current source transistor to the other common terminal;

emitter series resistors each being connected between the emitter of a respective one of the current-source transistors and the emitter potential supply terminal, the emitter series resistors connected to each given converter stage being differently dimensioned for providing a weighting corresponding to the bit value of the signal to be processed acting upon the double-throw switch in the given converter stage, depending on the value of the bit of the digital data word to be processed addressing the given converter stage;

the emitter doping, base doping and collector doping of the current-source transistor in the individual stages being equal, and the emitter areas of the current-source transistors being weighted in the same sense as the weighting of a constant current supplied by the current-source transistors;

the converter stages being divided into a first group with higher bit values and a second group with lower bit values, the emitter areas of the current-source transistors of the first group being weighted, the current-source transistors of the second group being identical and having the same emitter areas as one of the current-source transistors of the first group supplying a relatively small current and associated with the lowest bit value;

a reference circuit having an input and an output;
a reference voltage source feeding a reference current to the input of the reference circuit;
a first current reflector having a base point connected to the other common terminal, an output and an input, the first current reflector being formed of transistors;
first and second further transistors for the common control of the base terminals of the current-source transistors of the first group, the first and second transistors having the same emitter, base and collector conductivity type as the current-source transistors and the first and second transistors being complementary to the transistors of the first current reflector, the first transistor having a base connected to the output of the reference circuit, the base of the second transistor and the bases of the current-source transistors of the first group being jointly connected to the emitter of the first transistor, the collector of the first transistor being connected to the input of the first current reflector, the collector of the second transistor being connected to the input of the reference circuit acted upon by the reference current;

the emitter series resistors including a first emitter series resistor connected between the emitter of the first transistor and the emitter potential supply terminal, and a second emitter series resistor connected between the emitter of the second transistor and the emitter potential supply terminal, the emitter series resistance of the second emitter series resistor being equal to the emitter series resistance of the current-source transistor of the first group associated with one of the lowest bit values;

a second current reflector having a base point connected to the emitter potential supply terminal, an input connected to the output of the first current reflector, and identical output transistors each having a collector being connected to the base of a respective one of the current-source transistors of the second group; transmission transistors each having an emitter being connected to the base of a respective one of the current-source transistors of the second group and each having a base connected to the output of the reference circuit;

the transmission and output transistors being of the same type as the current-source transistors; and the emitter areas of the transmission transistors being binary-weighted according to the bit value associated with the current-source transistors of the second group controlled by the transmission transistors.

In accordance with another feature of the invention, the other common terminal is a reference or ground potential terminal.

In accordance with a further feature of the invention, the current-source transistors are npn-transistors. Because of this, the transistors of the second current reflector are likewise npn-transistors and the transistors of the first current reflector are pnp-transistors. The reference circuit furthermore preferably includes an operational amplifier constructed in bipolar technology.

In accordance with an added feature of the invention, the emitter area and the emitter series resistance of the second transistor have the same dimensions as the current-source transistor associated with the second lowest bit value of the first group.

In accordance with a concomitant feature of the invention, the input of the second current reflector is in the form of a transistor having a shorted collector-base junction, the input of the first current reflector is in the form of another transistor, the first current reflector includes a further transistor identical to and shunted across the emitter-base junction of the other transistor of the first current reflector, and the collector of the further transistor is connected to the emitter potential supply terminal.

Other features which are considered as characteristic for the invention are set forth in the appended claims.

Although the invention is illustrated and described herein as embodied in an integrable digital/analog converter, it is nevertheless not intended to be limited to the details shown, since various modifications and structural changes may be made therein without departing from the spirit of the invention and within the scope and range of equivalents of the claims.

Figure 2:
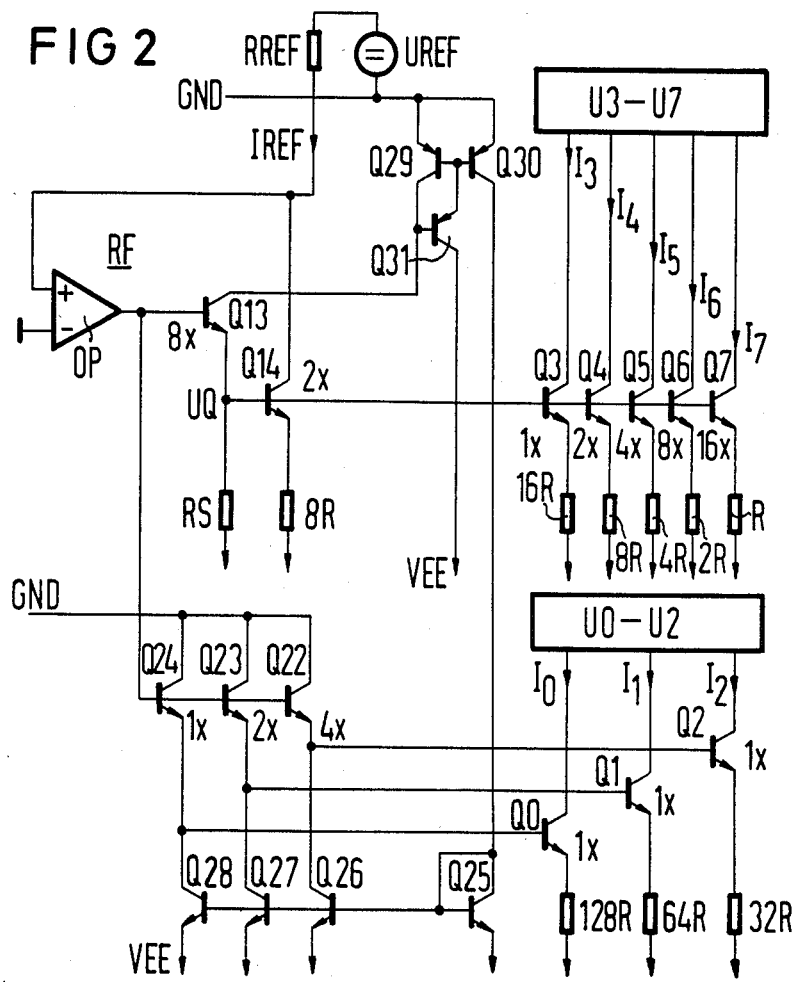

The construction and method of operation of the invention, however, together with additional objects and advantages thereof will be best understood from the following description of specific embodiments when read in connection with the accompanying drawings, in which:

FIG. 1 is a schematic circuit diagram of a prior art integrable digital/analog converter; and FIG. 2 is a circuit diagram of the D/A converter according to the invention.

Referring now to the figures of the drawings in detail and first particularly to FIG. 1 thereof, there is seen a circuit for a D/A converter in which four constant-current sources T0 to T4 are provided. Each of the constant-current sources are formed of a respective transistor (npn-transistors are exclusively used in the illustrated device), so that the D/A converter shown is provided for converting a 4-bit data word. The current-source transistors T0 to T4 are jointly controlled at the base thereof by an output of a common reference circuit RF which regulates a constant base potential. An R/2R network furnishing the emitter biases is connected to the emitter of the individual current-source transistor in the manner shown in FIG. 1, so that the transistors T0 to T4 always have a resistance 2R as the emitter series resistance, while the transistor T2 has an emitter series resistance of 3R; the transistor T3 has a resistance of 4R and the transistor T4 has a resistance of 4R.

The current source T0 serves as the power supply of the reference circuit RF, which is constructed in the usual manner, for instance, as an operational amplifier. The collector of the current-source transistor T1 is connected to a differential amplifier which is formed of two identical npn-transistors that are emitter-coupled and serve as a double-throw switch U1 The same type of connection applies to the collector of the current-source transistor T2, with respect to a double-throw switch U2 and it also applies to the transistor T3 with regard to the double-throw switch U3. On the other hand, the double-throw switch U4 which belongs to the current-source transistor T4, has a third transistor T7, the emitter of which is tied to the emitters of the other two transistors T5 and T6 in the double-throw switch U4. The wiring of these two transistors T5 and T6 corresponds to the two transistors of the remaining double-throw switches U1 to U3, since the base of the transistor T5 is controlled by the corresponding bit $b_4$ and its collector is connected to ground jointly with the collector of the corresponding transistors of the remaining double-throw switches. Meanwhile, the collector of the transistor T6 leads to the common output of the converter and the base thereof is controlled jointly with the bases of the corresponding transistors of the remaining double-throw switches. The collector of the third transistor T7, which has no counterpart in the other double-throw switches, is connected to ground and the transistor T7 is jointly controlled at its base with the transistors of the other double-throw switches (and therefore with the transistor T6, the collector of which is tied to the converter output).

With regard to the current-source transistors T1 to T3 of the prior art circuit according to FIG. 1, it can be said that due to the use of the inverting network shown, the currents flowing through these transistors are binary-weighted, assuming that the transistors have the same characteristic $I_E = f(U_{BE})$. However, since these transistors carry different currents, agreement between the effective characteristics cannot be expected because of the dependence of the base-emitter voltage on the current density. In order to take this under consideration, a binary gradation of the emitter areas of the current-source transistors is provided, as indicated by the number of emitter arrows at the individual current-source transistors. The current-source transistor T0 allows a reference current $I_o$ to flow-in through its emitter series resistor. If the absolute partial currents $I_1$ to $I_3$ change, such as because of a temperature influence, the current $I_o$ also changes. However, the current $I_o$ is monitored in the reference circuit RF and is regulated to a reference value, which then also applies to the other current-source transistors of the circuit shown in FIG. 1.

If the converter has a larger number of stages, each of which can be acted upon by a bit, the constant currents supplied and therefore the voltage drops at the corresponding emitter resistors become very small in the current sources for the stages of lowest bit significance. In order to take this into consideration, the last transistor T4 carries the same current as the transistor T3 in the prior art circuit according to FIG. 1. The current $I_4$ is only halved in the double-throw switch U4. Since the transistors forming the double-throw switches U1 to U4 have identical properties (which also applies with respect to the transistors T5, T6 and T7 in the double-throw switch U4), the current $I_4$ either flows to ground through the transistor T5 or it is distributed uniformly over the transistors T6 and T7. However, only the transistor T6 leads to the output of the converter. The transistor T6 therefore only receives a current share $I_4 = I_3/2$ from the last stage.

The following should be stated at this point with respect to the problem to be solved by the invention:

As is well known, digital-to-analog converters serve the purpose of converting a data word which is usually binary-encoded, into a current $I_A$ corresponding to the numerical value of the data word, or into a voltage corresponding to this numerical value. In this process, current switches assigned to the individual digits of the data word are switched over, as in the prior art device according to FIG. 1. The binary weighting can be performed before or after the switching-over stages. In the first case, the same current values flow in all of the current switch stages and are weighted, for instance, in a resistance network and converted into voltages. In the case of faster converters, this method has the disadvantage of causing greater capacity effects at the output of the converter. When weighting is performed before the double-throw switches, the circuit must be constructed in such a way that the current sources supplying the double-throw current switches furnish currents weighted in the correct ratio over the entire specified temperature range, which was already taken into consideration in the conventional circuit of FIG. 1.

As can be seen from FIG. 1, the current sources are formed in the prior art D/A converters with bipolar transistors and emitter resistors. FIG. 1 also illustrates that the base terminals of the current-source transistors are driven by a common control voltage. The weighting is accomplished on the basis of an appropriate setting of the emitter area ratios and the emitter series resistor ratios. However, since an emitter area ratio which is larger than $2^4$ cannot be logically provided between two otherwise equal transistors, especially with a monolithic construction of the converter, a different structure must be used in converters for longer data words.

A conventional way of accomplishing this is by placing the resistance network after the current switches. This can be done in such a way that each stage feeds the same current into a node of its own. An alternative thereto is provided if several weighted current sources are supported at a common node and this node is connected to another node through a current divider network, which in turn is likewise fed by weighted current sources.

Another possibility is described in U.S. Pat. No. 4,055,773. In that device, currents of the first four stages are weighted with an R/2R network on the emitter side of the current source transistors. The last current source is in duplicate (as in the circuit according to FIG. 1), and one of them draws the current from a further R/2R network which in turn again represents external wiring of several current sources.

As already mentioned and used in the circuit according to FIG. 1, the weighting can also be achieved by continuous halving of the emitter area and doubling of the emitter resistor. After weighting four to five times, the base-emitter voltage required, which accordingly is $(U_T \ln 2)$ times lower, can be obtained by adding an additional emitter resistance, instead of falling below the minimal emitter area that can be provided. In this connection, it should be stated, however, that due to the temperature dependence of the characteristic of the transistors, the voltage difference $U_T = (kT)/e$ (k = Boltzmann's constant, e = elementary charge, T = absolute temperature, $U_T$ = temperature voltage) changes according to the given relationship for $U_T$, which is also true for the prior art circuit according to FIG. 1. It can now be seen that because $d(kT/e)/dT = k/e$, a linear change with a change of the absolute temperature of the respective transistor region is unavoidable and that equalization cannot be achieved exclusively by gradation of the emitter area, for the purpose of increasing magnitude of the constant current to be generated. In this sense, the conventional circuit according to FIG. 1 is also in need of improvement.

A circuit for a digital/analog converter corresponding to the invention is shown in FIG. 2.

It should first be noted that, in contrast to FIG. 1, the details of the double-throw switches have been omitted in FIG. 2. The circuit shown in FIG. 2 corresponds to a digital/analog converter with eight converter stages, having current-source transistors Q0 to Q7, each of which can be connected in the manner seen in FIG. 1 to one double-throw switch U0, . . . U7 constructed as an emitter-coupled difference stage. Each are connected on one hand to the common output of the converter and on the other hand, to the terminal for the reference potential GND. The main part of the reference circuit RF is formed of an operational amplifier OP which is also constructed, for instance, in npn-bipolar technology. The inverting input of the operational amplifier is connected to the terminal for the reference potential GND, and the non-inverting input thereof forms the input for the reference current IREF. To this end, the non-inverting input of the operational amlifier OP is connected through a resistor RREF to one pole of a reference voltage source UREF, the other pole of which is also connected to the terminal for the reference potential GND.

In the circuit for a D/A converter according to the invention shown in FIG. 2, the current-source transistors Q0 to Q7 are all of the npn-type, as already mentioned, wherein the value of the emitter areas thereof is given by the respective numerical value provided with the symbol "×" (which must be multiplied by the basic emitter area, i.e., the emitter area of the current-source transistor Q0 of the converter stage to be driven by the lowest bit value, in order to obtain the effective emitter area). The numerical values given at the emitter series resistors n×R refer to the value of the resistance R for the converter stage associated with the highest bit value, i.e., the value of the emitter series resistor of its current-source transistor Q7. The currents supplied by the individual current-source transistors to the respectively associated switching mechanisms, are designated in a manner similar to FIG. 1.

In the circuit for a D/A converter shown in FIG. 2, the output of the operational amplifier is connected to the base of a first npn-transistor Q13, which is followed by a second npn-transistor Q14 as an emitter follower.

The emitter of the first npn-transistor Q13 is connected through a resistor RS to the terminal for the supply potential $V_{EE}$, as well as to the base of the second transistor Q14 and to the base terminal of the current-source transistors Q3 to Q7. The transistors Q3 to Q7 differ from each other by weighted emitter areas and therefore belong to the first group at the converter stages. The first npn-transistor Q13 carries out the control of the current-source transistors Q3 to Q7 by the operational amplifier OP and therefore by the reference circuit RF. The collector of the transistor Q13 is therefore connected to the input of first current reflector Q29, Q30, Q31, according to the invention.

In principle, any conventional current reflector circuit can be used for the current reflectors to be employed, as long as the first current reflector is constructed by using pnp-transistors and the second current reflector is constructed by using npn-transistors. As can be seen from FIG. 2, a so-called improved current reflector circuit is used in the present case. The current reflector is formed of the two pnp-transistors Q29 and Q30, the emitters of which are connected to the reference potential GND and the base terminals of which are connected to each other as well as to the emitter of the third pnp-transistor Q31. The collector of the transistor Q30 forms the output of the first current reflector circuit, while the collector of the transistor Q29 as well as the base of the transistor Q31, (which are addressed by the collector of the transistor Q13) jointly form the input of the first current reflector circuit. It should furthermore be mentioned that the collector of the pnp-transistor Q31 is connected to the terminal for the supply potential VEE. In addition, according to the description of the invention given above, the collector of the transistor Q30, which forms the output of the first current reflector circuit, is connected to the input of the second current reflector circuit.

The base point of the second current reflector circuit which is formed by npn-transistors, is represented by the terminal for the supply potential VEE. An input transistor Q25 is connected as a diode by providing a short circuit between its collector and its base. The emitter of the transistor Q25 is connected to the terminal for the supply potential VEE, while the base and the collector thereof are connected to the collector of the output transistor of the first current reflector, i.e., the transistor Q30, and in addition directly to the base terminals of output transistors Q26, Q27 and Q28. The second current reflector circuit is therefore a simple current reflector with an output which is provided by the collectors of each of the three output transistors Q26, Q27 and Q28. The second current reflector circuit is formed by npn-transistors, according to the invention.

According to the invention, the individual converter stages are divided into two groups. In the embodiment shown in FIG. 2, the converter stages with the current-source transistors Q3 to Q7 associated with the higher bit values of the converter includes six stages, while the second group of converter stages associated with the low bit values include three stages with bit values 1, 2 and 4 which contain the current-source transistors Q0, Q1 and Q2.

The control of the current-source transistors Q3 to Q7 (and therefore, generally, the control of the current-source transistors of the first group of converter stages) is accomplished by directly connecting the emitter of the transistor Q13 to the base terminal of the current-source transistors Q3 to Q7 of the first group of converter stages. The transistor Q13 is controlled at its base by the output of the operational amplifier OP and its collector is connected to the input of the first current reflector circuit Q29, Q30 and Q31, in the above-described manner. With respect to the second npn-transistor Q14, the base of which is likewise controlled by the emitter of the transistor Q13, it should furthermore be mentioned that in the illustrated embodiment, the weighting of the emitter series resistance and the emitter area of this transistor is equal to the next to the lowest bit value of the current-source transistors of the first group of converter stages, i.e. of the transistor Q4 as is also shown in FIG. 2. In addition, the collector of this transistor Q14 is directly connected to the non-inverting input of the operational amplifier OP.

In order to control the current-source transistors Q0 to Q2 of the converter stages in the second group, transmission transistors Q22, Q23, Q24 of the npn-type are provided. Each of the transmission transistors is acted upon at its base (corresponding to the transistor Q13) by the output of the operational amplifier OP. This is done by connecting (deviating from transistor Q13) the collector of these transmission transistors Q22 to Q24 to the terminal for the reference potential GND, and by not only connecting each of their emitters to the base of a respective one of the current-source transistors Q0 to Q2 provided in the second group of converter stages, but also a respective one of the collectors of the output transistors Q26, Q27 and Q28 provided in the second current reflector circuit. In addition, the emitter area of the transmission transistor Q24 associated with the lowest constant-current value has the same emitter area as the current-source transistors Q0 to Q2 and the current-source transistor Q3 (i.e., the current-source transistors of the second group and the current-source transistor of the lowest bit value in the first group of converter stages). The current-source transistor Q1 associated with the next to the highest bit value in the second group is controlled by the transmission transistor Q23. The emitter area of the transistor Q23 is twice as large as that of the current-source transistors Q0 to Q3. Meanwhile, the current-source transistor Q2 associated with the highest bit value in the second converter stage is controlled by the transmission transistor Q22 which has four-times the emitter area of the transistors Q0 to Q3. With respect to the weighting of the emitter series resistors, reference can be made to the values shown in FIG. 2.

The operation of the circuit according to the invention shown in FIG. 2, is as follows:

The current-source transistors of the first group, i.e., Q3 to Q7 are controlled by the operational amplifier OP through the emitter follower Q13. The operational amplifier OP receives its input voltage from a voltage drop which is generated by the transistor Q14 acting as a reference current source at the reference resistor RREF in the reference circuit RF.

The emitter areas of the current-source transistors Q3 to Q7 are binary-weighted, like the emitter series resistances of these transistors. Meanwhile, in the case of the current-source transistors Q0 to Q2, the emitter resistances are weighted, but the emitter areas are not. In order to achieve weighting of the currents $I_0$, $I_1$ and $I_2$, the base of the transistor Q2 must be controlled by the value of $(UQ-UT) \cdot \ln 2$, the base of the transistor Q1 by the value of $(UQ-UT) \cdot \ln 4$ and the base of the transistor Q2 by the value of $(UQ-UT) \cdot \ln 8$. As can be seen from FIG. 2, UQ is lower than the base potential of Q13 by $U_{BE}$ of Q13. As mentioned above, the base of the transistor Q22 is connected to the base of the transistor Q13 and the transistor Q22 has one-half the emitter area of the transistor Q13. If the same emitter current is caused to flow through the transistor Q22, as through Q13, the relationship $U_{BE}(Q22) = U_{BE}(Q13) + U_T \ln 2$ applies. The emitter of the transistor Q22 therefore becomes available for controlling the current source Q2. This principle is applied repeatedly to the current sources Q1 and Q0.

The goal of permitting the same emitter current to flow through the transistors Q22, Q23 and Q24 as through the transistor Q13, is achieved by the two current reflector circuits.

Optionally, a non-illustrated diode series circuit may be provided between the transistors Q30 and Q25, which is advantageous for compensating the early effect at the collector of the transistor Q30 in the first current reflector.

The above-described embodiment of the D/A converter according to the invention can be modified by using other customary current reflector circuits. In all cases, the first current reflector must be constructed with those transistors which are complementary to the current-source transistors in the converter stages, and the second current reflector should be constructed with transistors which are of the same type as the current-source transistors. In addition, the number of converter stages in the two groups can be changed, observing the principle seen in FIG. 2 and according to the invention.

The foregoing is a description corresponding in substance to German Application P No. 33 33 934.1, filed Sept. 20, 1983, the International priority of which is being claimed for the instant application, and which is hereby made part of this application. Any material discrepancies between the foregoing specification and the aforementioned corresponding German application are to be resolved in favor of the latter.

I claim:

1. Integrable digital/analog converter in bipolar technology for bits of a digital data word signal to be processed, comprising:

a signal output terminal;
another common terminal;
an emitter potential supply terminal;
individual converter stages each being assigned to a respective bit of the digital data signal to be processed, each converter stage including a transistor operated as a constant-current source and a double-throw switch connected to said constant-current source transistor, to said signal output terminal and to said other common terminal, for each of said converter stages, in the logical state "1" of the bit addressing the converter stage, said double-throw switch connecting the collector of said constant-current source transistor forming the output of said constant-current source to said signal output terminal of the converter, and in the logical state "0" of the bit, said double-throw switch connecting the collector of said constant-current source transistor to said other common terminal;
emitter series resistors each being connected between the emitter of a respective one of said current-source transistors and said emitter potential supply terminal, said emitter series resistors connected to each given converter stage being differently dimensioned for providing a weighting corresponding to the bit value of the signal to be processed acting upon said double-throw switch in said given converter stage, depending on the value of the bit of the digital data word to be processed addressing said given converter stage;
the emitter doping, base doping and collector doping of said current-source transistors in said individual stages being equal, and the emitter areas of said current-source transistors being weighted in the same sense as the weighting in the same sense as the weighting of a constant current supplied by said current-source transistors;
said converter stages being divided into a first group with higher bit values and a second group with lower bit values, the emitter areas of said current-source transistors of said first group being weighted, said current-source transistors of said second group being identical and having the same emitter areas as one of said current-source transistors of said first group supplying a relatively small current and associated with the lowest bit value;
a reference circuit having an input and an output;
a reference voltage source feeding a reference current to said input of said reference;
a first current reflector having a base point connected to said other common terminal, an output and an input, said first current reflector being formed of transistors;
first and second further transistors for the common control of the base terminals of said current-source transistors of said first group, said first and second transistors having the same emitter, base and collector conductivity type as said current-source transistors and said first and second transistors being complementary to said transistors of said first current reflector, said first transistor having a base connected to the output of said reference circuit, the base of said second transistor and the bases of said current-source transistors of said first group being jointly connected to the emitter of said first transistor, the collector of said first transistor being connected to said input of said first current reflector, the collector of said second transistor being connected to said input of said reference circuit acted upon by said reference current;
said emitter series resistors including a first emitter series resistor connected between the emitter of said first transistor and said emitter potential supply terminal, and a second emitter series resistor connected between the emitter of said second transistor and said emitter potential supply terminal, the emitter series resistance of said second emitter series resistor being equal to the emitter series resistance of said current-source transistor of said first group associated with one of the lowest bit values;
a second current reflector having a base point connected to said emitter potential supply terminal, an input connected to the output of said first current reflector, and identical output transistors each having a collector being connected to the base of a respective one of said current-source transistors of said second group;
transmission transistors each having an emitter being connected to the base of a respective one of said current-source transistors of said second group and each having a base connected to the output of said reference circuit;
said transmission and output transistors being of the same type as said current-source transistors; and the emitter areas of said transmission transistors being binary-weighted according to the bit value associated with the current-source transistors of said second group controlled by said transmission transistors.

2. Digital/analog converter according to claim 1, wherein said other common terminal is a reference potential terminal.

3. Digital/analog converter according to claim 1, wherein said other common terminal is a ground potential terminal.

4. Digital/analog converter according to claim 1, wherein said current-source transistors are npn-transistors.

5. Digital/analog converter according to claim 1, wherein the emitter area and the emitter series resistance of said second transistor have the same dimensions as said current-source transistor associated with the second lowest bit value of said first group.

6. Digital/analog converter according to claim 1, wherein said input of said second current reflector is in the form of a transistor having a shorted collector-base junction, said input of said first current reflector is in the form of another transistor, said first current reflector includes a further transistor identical to and shunted across the emitter-base junction of said other transistor of said first current reflector, and the collector of said further transistor is connected to said emitter potential supply terminal.

* * * * *